(12) United States Patent
Lai et al.

(10) Patent No.: US 12,362,256 B2
(45) Date of Patent: Jul. 15, 2025

(54) METHOD FOR FORMING SEMICONDUCTOR PACKAGE STRUCTURE

(71) Applicant: Taiwan Semiconductor Manufacturing Company, Ltd., Hsinchu (TW)

(72) Inventors: Po-Chen Lai, Hsinchu County (TW); Ming-Chih Yew, Hsinchu (TW); Po-Yao Lin, Zhudong Township, Hsinchu County (TW); Chin-Hua Wang, New Taipei (TW); Shin-Puu Jeng, Po-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/631,181

(22) Filed: Apr. 10, 2024

(65) Prior Publication Data

US 2024/0258193 A1    Aug. 1, 2024

Related U.S. Application Data

(62) Division of application No. 17/527,831, filed on Nov. 16, 2021, now Pat. No. 11,984,381.

(Continued)

(51) Int. Cl.
*H01L 23/367*    (2006.01)
*H01L 21/48*    (2006.01)
(Continued)

(52) U.S. Cl.
CPC ...... *H01L 23/3675* (2013.01); *H01L 21/4817* (2013.01); *H01L 23/49833* (2013.01);
(Continued)

(58) Field of Classification Search
CPC ............ H01L 23/3675; H01L 21/4817; H01L 23/49833; H01L 25/0655; H01L 23/42;
(Continued)

(56) References Cited

U.S. PATENT DOCUMENTS

2005/0184381 A1\* 8/2005 Asahi ............... H01R 13/2414
257/693
2016/0284670 A1   9/2016 Hung et al.
(Continued)

FOREIGN PATENT DOCUMENTS

CN    207705152 U    8/2018
CN    212648227 U    3/2021
(Continued)

*Primary Examiner* — Patricia D Valenzuela
(74) *Attorney, Agent, or Firm* — Birch, Stewart, Kolasch & Birch, LLP

(57) ABSTRACT

A method of forming a semiconductor package structure is provided. The method includes disposing a first semiconductor device on an interposer substrate, disposing the interposer substrate on a carrier substrate, applying a thermal interface material on the first semiconductor device, and attaching a lid on the carrier substrate to cover the first semiconductor device. The interposer substrate is disposed between the carrier substrate and the first semiconductor device. The lid includes a lower surface having a first recess facing the first semiconductor device, and a portion of the thermal interface material is accommodated in the first recess.

20 Claims, 12 Drawing Sheets

Related U.S. Application Data

(60) Provisional application No. 63/188,106, filed on May 13, 2021.

(51) Int. Cl.
*H01L 23/498* (2006.01)
*H01L 25/065* (2023.01)
*H01L 23/00* (2006.01)
*H01L 23/42* (2006.01)
*H01L 23/433* (2006.01)

(52) U.S. Cl.
CPC .......... *H01L 25/0655* (2013.01); *H01L 23/42* (2013.01); *H01L 23/433* (2013.01); *H01L 23/49816* (2013.01); *H01L 24/73* (2013.01); *H01L 2924/1611* (2013.01); *H01L 2924/16152* (2013.01); *H01L 2924/16251* (2013.01); *H01L 2924/3511* (2013.01); *H01L 2924/35121* (2013.01)

(58) Field of Classification Search
CPC . H01L 23/433; H01L 23/49816; H01L 24/73; H01L 2924/1611; H01L 2924/16152; H01L 2924/16251; H01L 2924/3511; H01L 2924/35121; H01L 24/13; H01L 24/32; H01L 23/562; H01L 23/10; H01L 24/16; H01L 24/29; H01L 24/81; H01L 24/83; H01L 24/92; H01L 2224/13111; H01L 2224/13139; H01L 2224/13144; H01L 2224/16225; H01L 2224/2919; H01L 2224/29191; H01L 2224/32225; H01L 2224/73204; H01L 2224/81424; H01L 2224/81439; H01L 2224/81444; H01L 2224/81447; H01L 2224/81455; H01L 2224/81457; H01L 2224/81484; H01L 2224/81801; H01L 2224/834; H01L 2224/83487; H01L 2224/83488; H01L 2224/8349; H01L 2224/8359; H01L 2224/83686; H01L 2224/83693; H01L 2224/83862; H01L 2224/83874; H01L 23/04; H01L 2224/92125; H01L 2924/15192; H01L 2924/15311; H01L 2924/181; H01L 2924/18161; H01L 23/5384; H01L 23/3737; H01L 21/52; H01L 21/56; H01L 23/3128; H01L 23/49838

See application file for complete search history.

(56) References Cited

U.S. PATENT DOCUMENTS

2020/0227336 A1\* 7/2020 Eid .................. H01L 29/0657
2021/0384100 A1\* 12/2021 Ryu ..................... H01L 24/32

FOREIGN PATENT DOCUMENTS

| TW | 201603235 A | 1/2016 |
| TW | 201830597 A | 8/2018 |
| TW | 201903996 A | 1/2019 |
| TW | 202002208 A | 1/2020 |
| TW | 202105640 A | 2/2021 |

\* cited by examiner

METHOD FOR FORMING SEMICONDUCTOR PACKAGE STRUCTURE

PRIORITY CLAIM AND CROSS-REFERENCE

This application is a is a Divisional application of U.S. patent application Ser. No. 17/527,831, filed on Nov. 16, 2021, which claims priority to U.S. Provisional Application Ser. No. 63/188,106, filed on May 13, 2021, the entirety of which is incorporated by reference herein.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package (structure) not only provides protection for semiconductor devices from environmental contaminants, but also provides a connection interface for the semiconductor devices packaged therein. Smaller package structures, which take up less area or are lower in height, have been developed to package the semiconductor devices.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
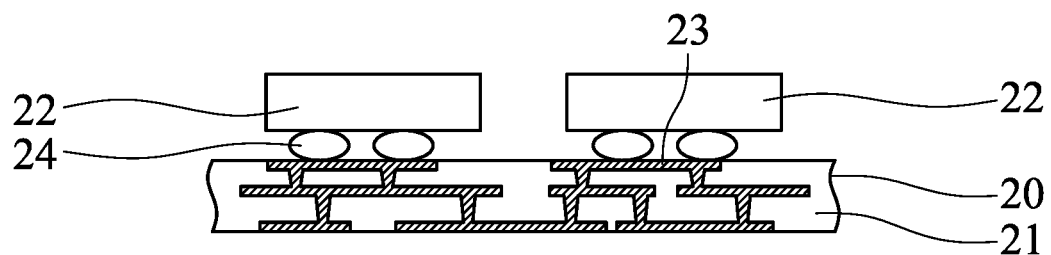
FIG. 1A to FIG. 1I shows a fabricating procedure of a semiconductor package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%. The terms "each" in the description are to be interpreted so as not to exclude variations among units and not to exclude an omission of a part of the units.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor package structure and the method for forming the same are provided in accordance with various embodiments. Some variations of embodiments are discussed. Throughout the various views and illustrative embodiments, like reference numbers are used to designate like elements. In accordance with some embodiments of the present disclosure, a semiconductor package structure includes a cover element (stress-relief structure), such as a lid structure, for controlling warpage of a package substrate. In some embodiments, a recess is formed on a surface of the lid facing a semiconductor device. A thermal interface material is sandwiched or filled between the lid and the semiconductor device and in the recess of the lid. The recess of the lid prevents or reduces a gap from occurring between the lid and the semiconductor package structure, and allows the thermal interface material to have better contact with the lid. Accordingly, the reliability and the heat dissipation of the semiconductor package structure are improved.

FIG. 1A to FIG. 1I show a fabricating procedure of a semiconductor package structure, in accordance with some embodiments. In some embodiments, as shown in FIG. 1A, semiconductor devices 22 are disposed over an interposer substrate 20. In some embodiments, the interposer substrate 20 is supported by a first intermediate substrate. In some embodiments, the interposer substrate 20 includes a board 21 and conductive structures 23. The conductive structures 23 may be made of or include copper, aluminum, cobalt, nickel, gold, silver, tungsten, one or more other suitable materials, or a combination thereof. The board 21 may be made of or include a polymer material, a ceramic material, a metal material, a semiconductor material, one or more other suitable materials, or a combination thereof. For example, the board 21 includes resin, prepreg, glass, and/or ceramic. In cases where the board 21 is made of a metal material or a semiconductor material, dielectric layers may be formed between the board 21 and the conductive structures 23 to prevent short circuiting.

In cases where the board 21 is made of or includes a polymer material, the board 21 may further include fillers that are dispersed in the polymer material. The polymer material may be made of or include epoxy-based resin, polyimide-based resin, one or more other suitable polymer materials, or a combination thereof. The examples of the fillers may include fibers (such as silica fibers and/or carbon-containing fibers), particles (such as silica particles and/or carbon-containing particles), or a combination thereof.

In some embodiments, the semiconductor devices 22 are functional integrated circuit (IC) dies such as a semiconductor die, an electronic die, a Micro-Electro Mechanical Systems (MEMS) die, or a combination thereof. The functional IC die may include one or more application processors, logic circuits, memory devices, power management integrated circuits, analog circuits, digital circuits, mixed signal circuits, one or more other suitable functional integrated circuits, or a combination thereof, depending on actual needs. In some alternative embodiments, the semiconductor device 22 is a package module that has one or more semiconductor dies and an interposer substrate carrying these semiconductor dies. These structures of the semiconductor devices 22 are well known in the art and therefore not described herein. The semiconductor devices 22 can be fabricated by various processes such as deposition, etching, implantation, photolithography, annealing, and/or other suitable processes.

In some embodiments, the semiconductor devices 22 are bonded onto conductive structures 24. The conductive structures 24 may include conductive pillars, solder bumps, one or more other suitable bonding structures, or a combination thereof, in accordance with some embodiments of the present disclosure. The conductive structures 24 are made of a solder material, such as Sn and Ag or another suitable conductive material (e.g., gold), in accordance with some embodiments of the present disclosure. The conductive structures 24 are solder balls, in accordance with some embodiments. A reflow process (not shown) may be performed to make the metallurgical connections between the semiconductor device 22, the conductive structures 24, and the interposer substrate 20, in accordance with some embodiments of the present disclosure.

Figure 1B:
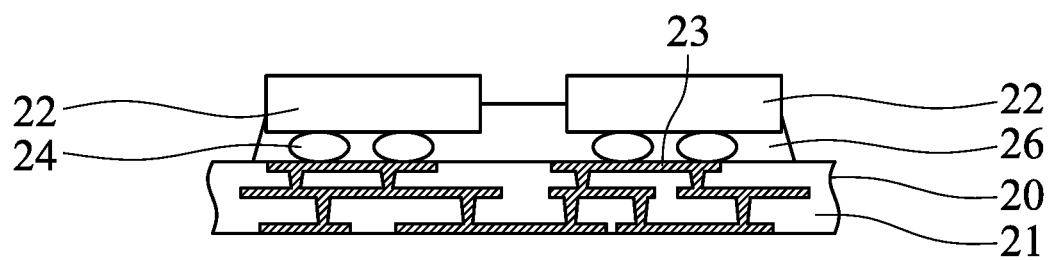

In some embodiments, as shown in FIG. 1B, an underfill layer 26 is dispensed (e.g., by a dispenser (not shown)) into the space between each semiconductor device 22 and the interposer substrate 20 and the space between adjacent conductive structures 24, and then cured (e.g., ultraviolet (UV) or thermally cured) to harden. The underfill layer 26 may be configured to provide a stronger mechanical connection and a heat bridge between the semiconductor device 22 and the interposer substrate 20, to reduce cracking in the conductive structures 24 caused by thermal expansion mismatches between the semiconductor device 22 and the interposer substrate 20, and to protect the joints from contaminants, thereby improving reliability of the fabricated semiconductor package structure 100 (FIG. 1I), in accordance with some embodiments of the present disclosure. In some embodiments, the underfill layer 26 includes liquid epoxy, deformable gel, silicon rubber, or the like.

Figure 1C:
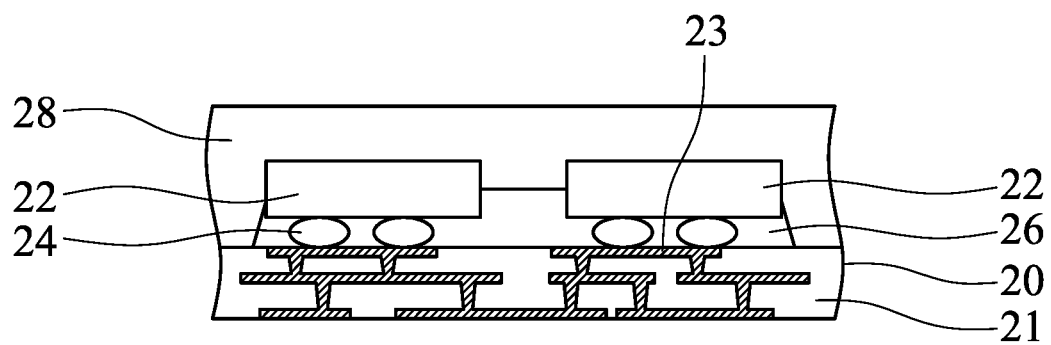

As shown in FIG. 1C, a molding layer 28 is formed over the semiconductor devices 22, the underfill layer 26, and the interposer substrate 20 to encapsulate the elements, in accordance with some embodiments. The molding layer 28 fills gaps between the semiconductor devices 22, in accordance with some embodiments. The molding layer 28 in the gaps surrounds the semiconductor devices 22, in accordance with some embodiments. The molding layer 28 may be configured to provide package stiffness, a protective or hermetic shielding, and/or provide a heat conductive path to prevent chip overheating, in accordance with some embodiments of the present disclosure. The molding layer 28 may be formed by a spin-on coating process, an injection molding process, or the like, in accordance with some embodiments of the present disclosure.

The molding layer 28 includes a polymer material, in accordance with some embodiments. The term "polymer" here can represent thermosetting polymers, thermoplastic polymers, or any mixtures thereof, in accordance with some embodiments. The polymer material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding layer 28 can be made of epoxy resin, such as epoxy cresol novolac (ECN), biphenyl epoxy resin, multifunctional liquid epoxy resin, or any combinations thereof, in accordance with some embodiments. In still other embodiments, the molding layer 28 can be made of epoxy resin optionally including one or more fillers to provide the composition with any of a variety of desirable properties. Examples of fillers can be aluminum, titanium dioxide, carbon black, calcium carbonate, silica, or any combinations thereof, in accordance with some embodiments. A thermal process is performed on the molding layer 28 to cure the molding layer 28, in accordance with some embodiments of the present disclosure.

Figure 1D:
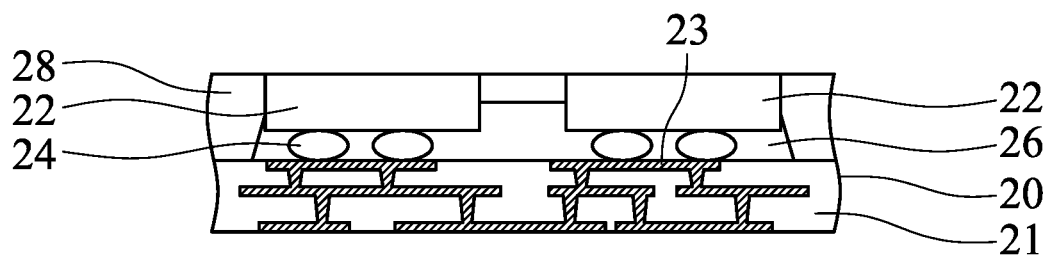

As shown in FIG. 1D, an upper portion of the molding layer 28 is removed to expose top surfaces of the semiconductor devices 22, in accordance with some embodiments. After the removal process, a top surface of the molding layer 28 is substantially coplanar with or aligned with the top surfaces of the semiconductor device 22, in accordance with some embodiments. The removal process includes a chemical mechanical polishing (CMP) process or another suitable grinding or etching process, in accordance with some embodiments.

Figure 1E:
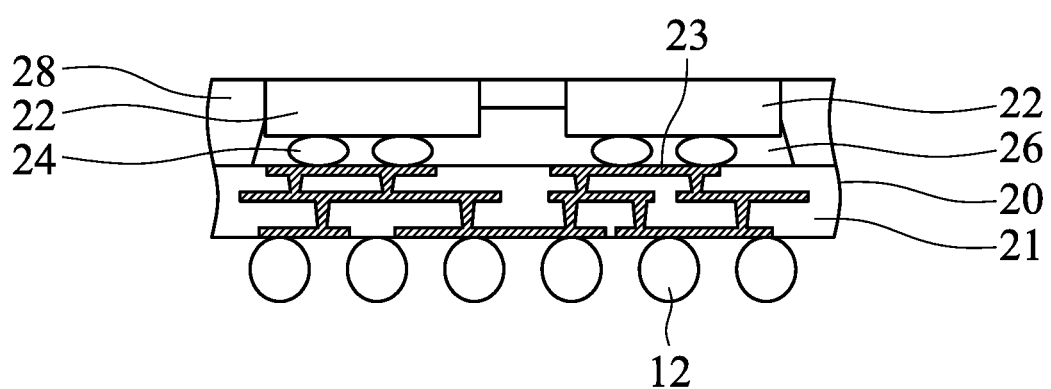

As shown in FIG. 1E, conductive structures 12 are provided on the interposer substrate 20. In some embodiments, the conductive structures 12 may include conductive pillars, solder bumps, one or more other suitable bonding structures, or a combination thereof. The conductive structures 12 are made of a solder material, such as Sn and Ag or another suitable conductive material (e.g., gold), in accordance with some embodiments. The conductive structures 12 are solder balls, in accordance with some embodiments. In the embodiments wherein the interposer substrate 20 is provided on the first intermediate substrate, a second substrate is provided on the molding layer 28, and then the first intermediate substrate is removed to allow the conductive structures 12 being disposed on the intermediate substrate 20.

Figure 1F:
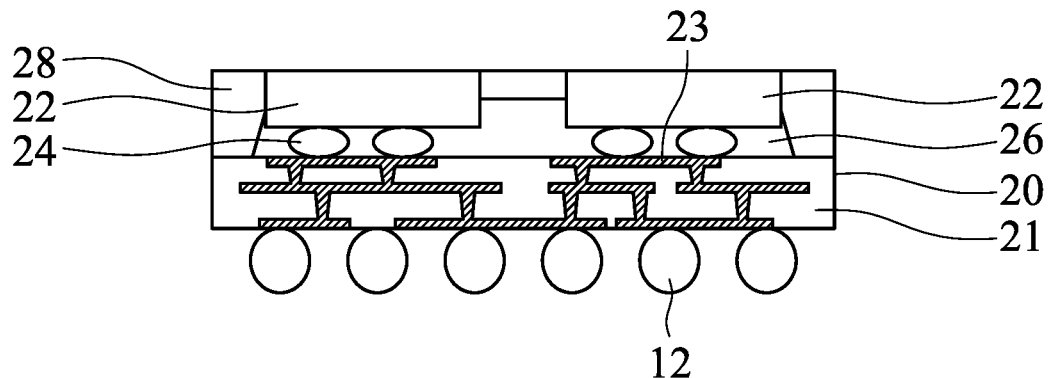

As shown in FIG. 1F, a cutting process is performed to cut the above structure into pieces. In some embodiments, the sidewall of the interposer substrate 20 is aligned with the sidewall of the molding layer 28.

Figure 1G:
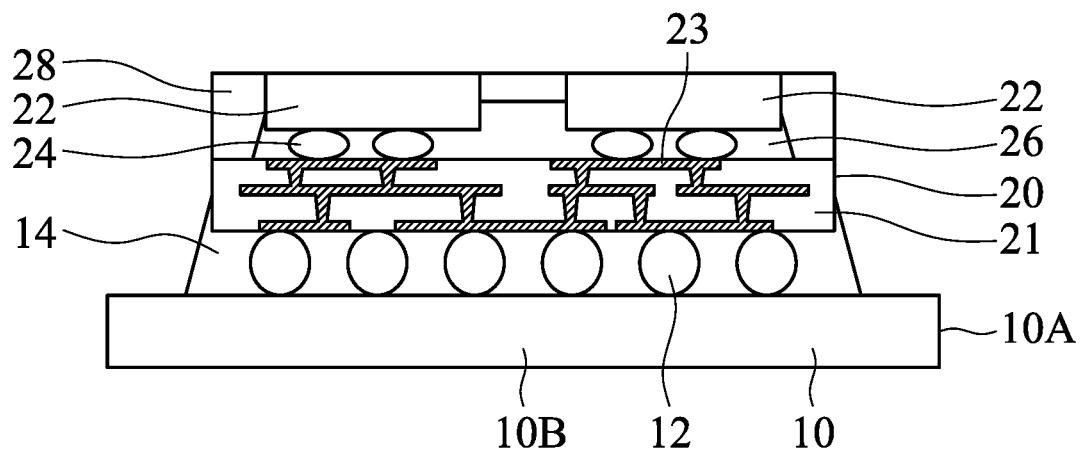

In FIG. 1G, the interposer substrate 20 is disposed on a carrier substrate 10 through the conductive structures 12. In some embodiments of the present disclosure, the carrier substrate 10 include an edge 10A and a center portion 10B surrounded by the edge 10A. In some embodiments, the carrier substrate 10 is a semiconductor substrate. By way of example, the material of the carrier substrate 10 may include elementary semiconductor such as silicon or germanium; a compound semiconductor such as silicon germanium, silicon carbide, gallium arsenic, gallium phosphide, indium phosphide or indium arsenide; or combinations thereof. Alternatively, the carrier substrate 10 may be a silicon-on-insulator (SOI) substrate, a germanium-on-insulator (GOI) substrate, or the like. In some other embodiments, the carrier substrate 10 is a printed circuit board (PCB), a ceramic substrate, or another suitable package substrate. The carrier substrate 10 may be a core or a core-less substrate, in accordance with some embodiments. A reflow process (not shown) may be performed to make the metallurgical connections between the carrier substrate 10, the conductive structures 12, and the interposer substrate 20, in accordance with some embodiments of the present disclosure. In some embodiments, the second intermediate substrate is removed after the interposer substrate 20 is disposed on the carrier substrate 10.

In some embodiments of the present disclosure, the carrier substrate 10 has various device elements (not shown). Examples of device elements that are formed in or on the carrier substrate 10 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The carrier substrate 10 may also have one or more circuit layers (not shown) used to electrically connect the device elements and semiconductor devices that are subsequently attached.

The carrier substrate 10 generally has a rectangular (or square) shape in a top view, depending on design requirements, although other shapes may also be used. Also, the carrier substrate 10 has opposite surfaces, which may be substantially parallel to each other. The upper surface may be used to receive and bond other package components of the package. Several electrical connectors (not shown) may be provided on the lower surface to enable electrical connection between the carrier substrate 10 and an external electronic device such as a PCB (not shown). The electrical connectors may be or include solder balls such as tin-containing solder balls, in accordance with some embodiments of the present disclosure.

In some embodiments, an underfill layer 14 is dispensed (e.g., by a dispenser (not shown)) into the space between the interposer substrate 20 and the carrier substrate 10 and the space between adjacent conductive structures 12, and then cured (e.g., ultraviolet (UV) or thermally cured) to harden. The underfill layer 14 may be configured to provide a stronger mechanical connection and a heat bridge between the interposer substrate 20 and the carrier substrate 10, to reduce cracking in the conductive structures 12 caused by thermal expansion mismatches between the interposer substrate 20 and the carrier substrate 10, and to protect the joints from contaminants, thereby improving reliability of the fabricated semiconductor package structure 100 (FIG. 1I). In some embodiments, the underfill layer 14 includes liquid epoxy, deformable gel, silicon rubber, or the like.

Figure 1H:
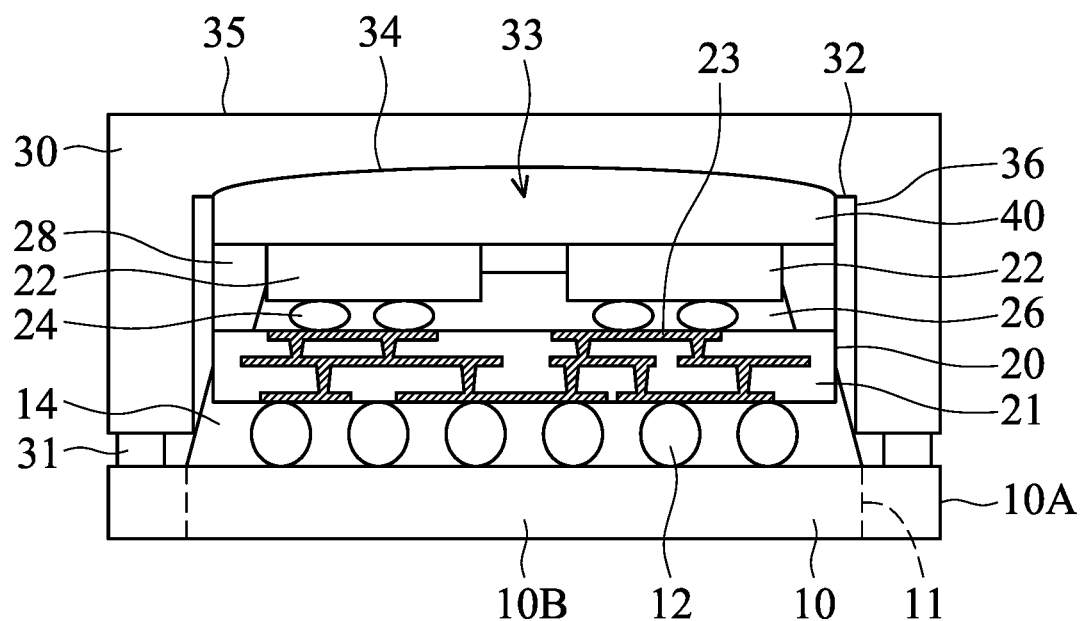
Figure 1I:
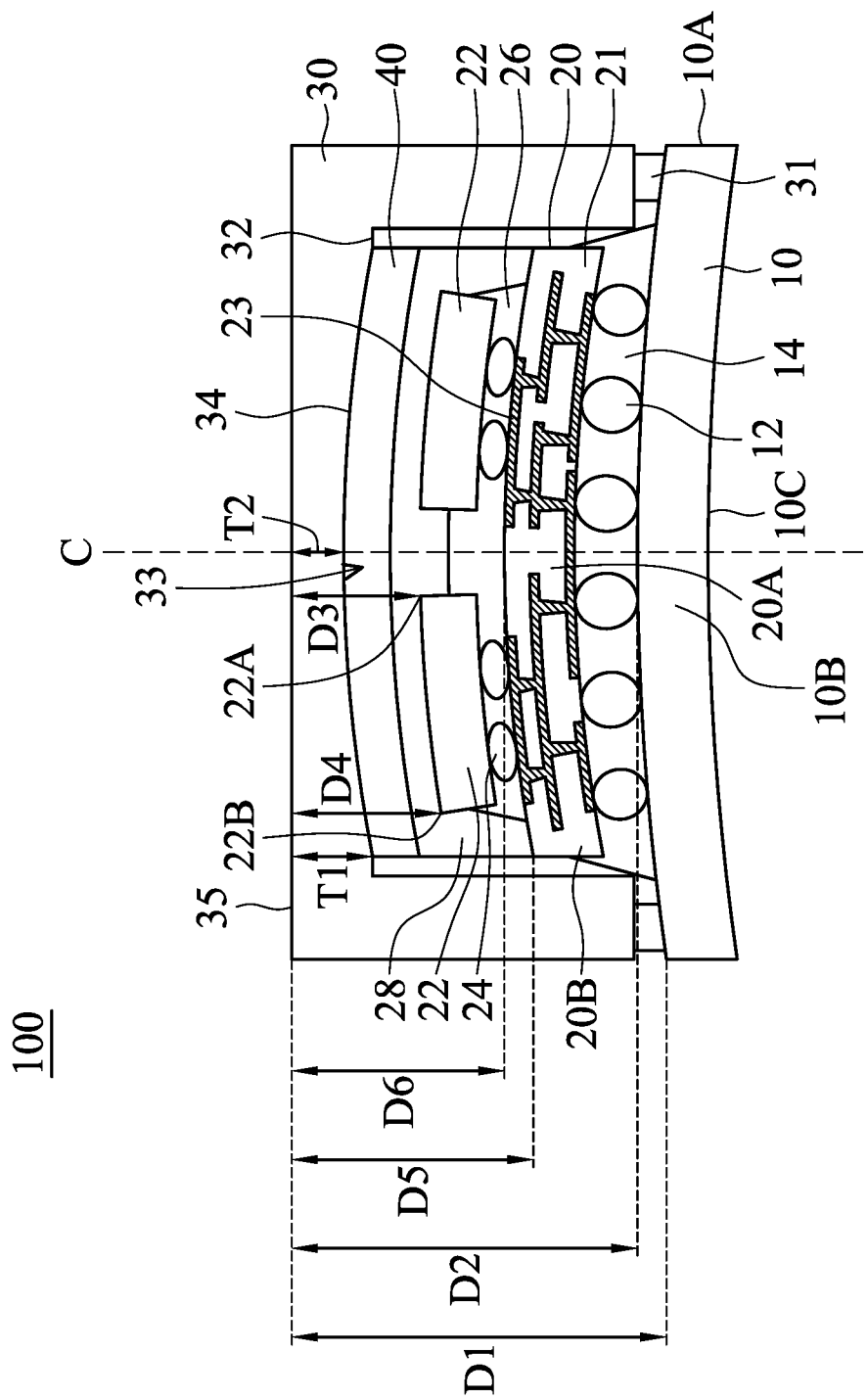

As shown in FIG. 1H, a thermal interface material (TIM) 40 is provided on the semiconductor devices 22 and the molding layer 28, in accordance with some embodiments of the present disclosure. In some embodiments, the thermal interface material 40 may be used for filling or reducing the gaps between the semiconductor devices 22 and the lid 30 (which will be described later) to facilitate the heat conduction between the elements.

In some embodiments, the thermal interface material 40 may have a higher thermal conductivity than a typical adhesive material. In some embodiments, the thermal interface material 40 has a thermal conductivity between about 3 W/m-K to 8 W/m-K, although its thermal conductivity may also be slightly higher or lower. The thermal interface material 40 may include an organic material, and it may also act as an adhesive. In some embodiments, the thermal interface material 40 comprises a polymer matrix, a phase change polymer, a silicone-based matrix, a matrix additive (fluxing agent), a filler material (a metallic core with an organic solderability preservative coating), or the like. The thermal interface material 40 may be dispensed in a liquid form that has a high viscosity, in accordance with some embodiments of the present disclosure.

In FIG. 1H, a lid 30 is provided on the carrier substrate 10 to cover the semiconductor devices 22, and the lid 30 is in contact with the thermal interface material 40, in accordance with some embodiments of the present disclosure. Adhesive element 31 is provided between the carrier substrate 10 and the lid 30, in accordance with some embodiments of the present disclosure. The adhesive element 31 may be configured to bond the lid 30 to the carrier substrate 10.

In some embodiments, the lid 30 is used to constrain the carrier substrate 10 to alleviate its warpage and/or to enhance robustness of the carrier substrate 10. In some embodiments, the material of the lid 30 may include metal such as copper, stainless steel, stainless steel/Ni, or the like, but is not limited thereto. In some embodiments, the lid 30 is used for heat dissipation, so the heat generated by the semiconductor devices 22 may be released.

In some embodiments, the adhesive element 31 may be applied to the carrier substrate 10 before installing the lid 31 on the carrier substrate 10. Examples of the material for the adhesive element 31 may include organic adhesive material such as epoxy, polyimide (PI), polybenzoxazole (PBO), benzo-cyclo-butene (BCB), but are not limited thereto.

A recess 33 is formed on a lower surface 32 of the lid 30 facing the semiconductor devices 22, in accordance with some embodiments of the present disclosure. In some embodiments, the recess 33 may be formed by a mechanical drilling process with computer numeric control (CNC). In such embodiments, material is removed by a mechanical drill, with the position of the drill being controlled by a computer or controller. Removal may also be accomplished by other processes, such as a laser cutting process, a laser drilling process, or the like. In some embodiments, the recess 33 has a bottom surface 34 facing the semiconductor devices 22, and the thermal interface material 40 is in contact with the bottom surface 34 of the recess 33 and the semiconductor devices 22 to fill the gap between the elements. The recess 33 allows the lower surface of the lid 30 more compliant to the top surface of the package, to reduce the bond line thickness (BLT) difference between package center and corner, in accordance with some embodiments of the present disclosure. Therefore, the heat dissipation ability and the reliability of the semiconductor package structure 100 are enhanced, in accordance with some embodiments of the present disclosure.

In some embodiments, the center portion 10B is surrounded by the edge portion 10A. In some embodiments, a boundary 11 between the edge 10A and the center portion 10B is aligned with an inner side surface 36 of the lid in a direction perpendicular to the top surface 35 of the lid 30.

As shown in FIG. 1I, a heating process is performed to the semiconductor package structure 100 for package assembly, in accordance with some embodiments of the present disclosure. The above-mentioned various package components and substrate materials used in the semiconductor package structure 100 may have different coefficient of thermal expansions (CTEs). Hence, when the package undergoes thermal cycling during package assembly, reliability testing, or filed operation, the package components and substrate materials may expand at different rates, causing the carrier substrate 10 and the interposer substrate 20 tends to warp. Such deformation may cause the thermal interface material 40 delamination at corners or edges of the package, and impact the performance of heat dissipation. The issue can be solved by the recess 33 formed on the lid 30 in some embodiments of the present disclosure.

In some embodiments of the present disclosure, a distance D1 between the edge 10A of the carrier substrate 10 to a top surface 35 of the lid 30 is different from a distance D2 between the center portion 10B of the carrier substrate 10 to the top surface 35 of the lid 30. For example, the distance D1 between the edge 10A of the carrier substrate 10 to the top surface 35 of the lid 30 is greater than the distance D2 between the center portion 10B of the carrier substrate 10 to the top surface 35 of the lid 30, in accordance with some embodiments of the present disclosure. In some embodiments, the carrier substrate 10 includes a lower surface 10C concave toward the lid 30 after the heating process.

In some embodiments of the present disclosure, the semiconductor device 22 includes a first point 22A and a second point 22B separated from each other. In a direction perpendicular to the top surface 35 of the lid 30, a distance D3 between the top surface 35 of the lid 30 and the first point 22A is different from a distance D4 between the top surface 35 of the lid 30 and the second point 22B, in accordance with some embodiments of the present disclosure. For example, in some embodiments, a center line C crosses the center of the semiconductor package structure 100, the first point 22A is closer to the center line C of the semiconductor package structure 100, and the second point 22B is farther away from the center line C of the semiconductor package structure 100. Therefore, when the carrier substrate 10 and the interposer substrate 20 deform during the heating process, the first point 22A becomes closer to the top surface 35 of the lid 30, and the second point 22B is farther away from the top surface 35 of the lid 30, in accordance with some embodiments of the present disclosure. Therefore, the distance D3 between the first point 22A of the semiconductor device 22 and the top surface 35 of the lid 30 is less than the distance D4 between the second point 22B of the semiconductor device 22 and the top surface 35 of the lid 30, in accordance with some embodiments of the present disclosure. In some embodiments, the top surface 35 of the lid 30 and the top surface of the semiconductor device 22 face different directions.

In some embodiments, the interposer substrate 20 includes a middle portion 20A and an edge portion 20B surrounding the middle portion 20A. In the direction perpendicular to the top surface 35 of the lid 30, a distance D5 is between the top surface 35 of the lid 30 and the edge portion 20B of the interposer substrate 20, a distance D6 is between the top surface 35 of the lid 30 and the middle portion 20A of the interposer substrate 20, and the distance D5 may be greater than the distance D6, in accordance with some embodiments of the present disclosure.

In some embodiments of the present disclosure, the depth of the recess 33 of the lid 30 may be measured from a boundary point of the recess 33 to a bottom point of the recess 33 along a normal direction perpendicular to the top surface 35 of the lid 30. For instance, a depth of the recess 33 of the lid 30 may be measured as the maximum thickness of the lid 30 minus the minimum thickness of the lid 30 along the direction perpendicular to the top surface 35 of the lid 30. For example, as shown in FIG. 1I, the lid has a highest thickness T1 (i.e. the greatest distance between the top surface 35 of the lid 30 and the thermal interface material 40) and a lowest thickness T2 (i.e. the lowest distance between the top surface 35 of the lid 30 and the thermal interface material 40). In some embodiments, the difference between the thickness T1 and the thickness T2 (i.e. T1-T2) is between 0.02 mm and 0.1 mm. In other words, the depth of the recess 33 is between 0.02 mm and 0.1 mm, in accordance with some embodiments of the present disclosure.

Figure 2A:
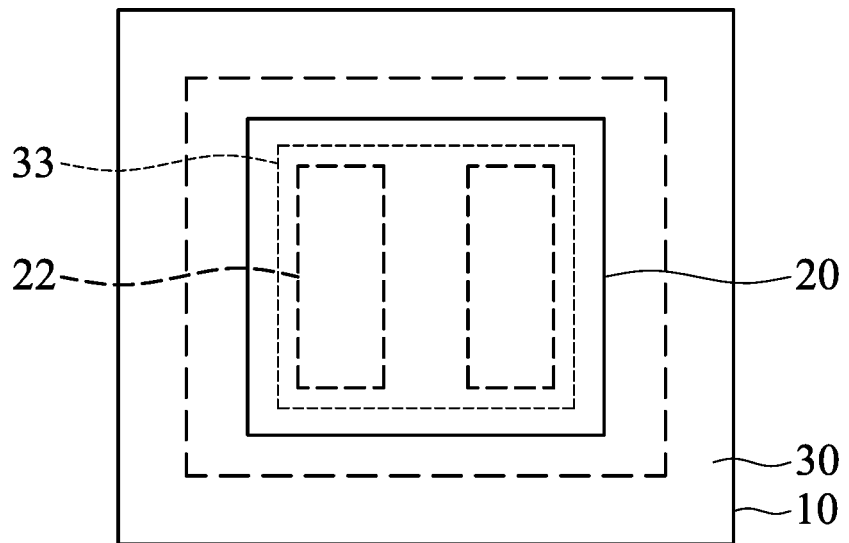
FIG. 2A is a top view of a semiconductor package structure, in accordance with some embodiments.

FIG. 2A is a top view of the semiconductor package structure 100, in accordance with some embodiments of the present disclosure. In FIG. 2A, two semiconductor devices 22 are accommodated in the recess 33 of the lid 30, in accordance with some embodiments. In some embodiments, the area of the recess 33 is greater than the sum of the areas of the semiconductor devices 22. The area of the recess 33 is less than the area of the interposer substrate 20, in accordance with some embodiments of the present disclosure. Such configuration reduces the gap between the lid 30 and the thermal interface material 40, so the heat generated by the semiconductor devices 22 may be further dissipated, in accordance with some embodiments of the present disclosure.

Figure 2B:
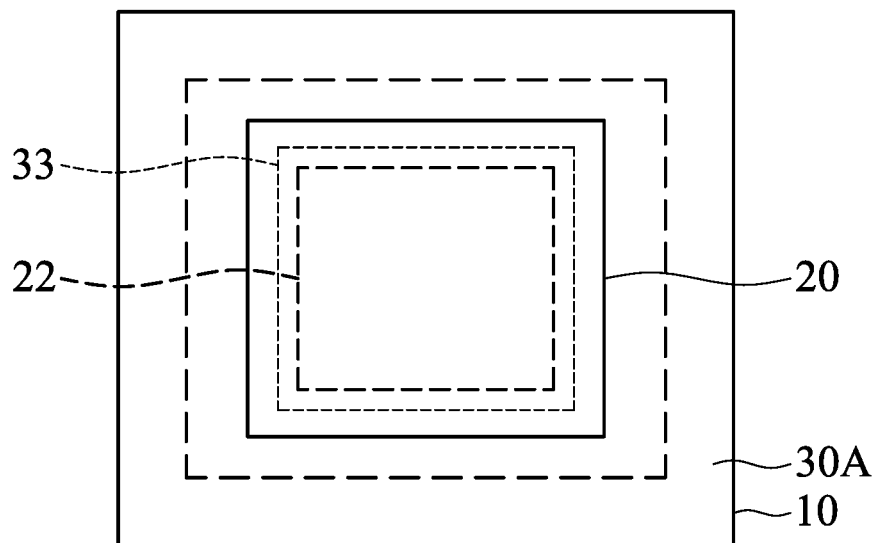
FIG. 2B is a top view of a semiconductor package structure, in accordance with some embodiments.

FIG. 2B is a top view of a semiconductor package structure 100A, in accordance with some embodiments of the present disclosure. The semiconductor package structure 100A includes one semiconductor device 22, in accordance with some embodiments of the present disclosure. In some embodiments, the semiconductor device 22 is accommodated in the recess 33 of the lid 30A in the top view. In other words, the area of the semiconductor device is less than the area of the recess 33 in the top view. The recess 33 of the lid 30A is accommodated in the interposer substrate 20 in the top view of the semiconductor package structure 100A, in accordance with some embodiments of the present disclosure. In some embodiments, the area of the recess 33 is less than the area of the interposer substrate 20. For example, a ratio between the area of the recess 33 and the area of the interposer substrate 20 is between 0.3 and 0.9 to allow the recess 33 being accommodated inside the interposer substrate 20 in the top view.

Figure 2C:
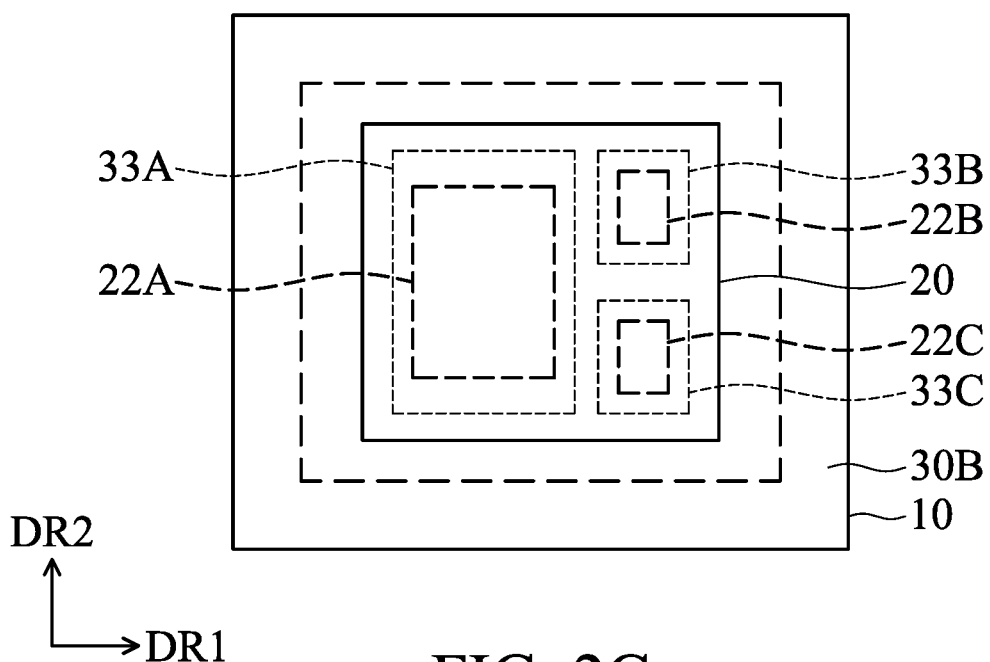
FIG. 2C is a top view of a semiconductor package structure, in accordance with some embodiments.

FIG. 2C is a top view of a semiconductor package structure 100B, in accordance with some embodiments of the present disclosure. In some embodiments, the semiconductor package structure 100B includes a first semiconductor device 22A, a second semiconductor device 22B, and a third semiconductor device 22C. The lid 30B of the semiconductor package structure 100B includes a first recess 33A, a second recess 33B, and a third recess 33C separated from each other, in accordance with some embodiments of the present disclosure.

In some embodiments, the first semiconductor device 22A, the second semiconductor device 22B, and the third semiconductor device 22C are respectively inside the first recess 33A, the second recess 33B, and the third recess 33C in the top view. In some embodiments, the area of the first semiconductor device 22A is less than the area of the first recess 33A, the area of the second semiconductor device 22B is less than the area of the second recess 33B, and the area of the third semiconductor device 22C is less than the area of the third recess 33C. In some embodiments, the first recess 33A and the second recess 33B are arranged in a first direction DR1. In some embodiments, the first recess 33A and the third recess 33C are arranged in the first direction DR1. In some embodiments, the second recess 33B and the third recess 33C are arranged in a second direction DR2, wherein the first direction DR1 and the second direction DR2 are different. For example, in some embodiments, the first direction DR1 is perpendicular to the second direction DR2. In some embodiments, the area of the first recess 33A, the area of the second recess 33B, and the area of the third recess 33C are different. In some embodiments, the depth of the recess 33A, 33B, 33C may be identical or different, depending on design requirement.

Figure 3A:
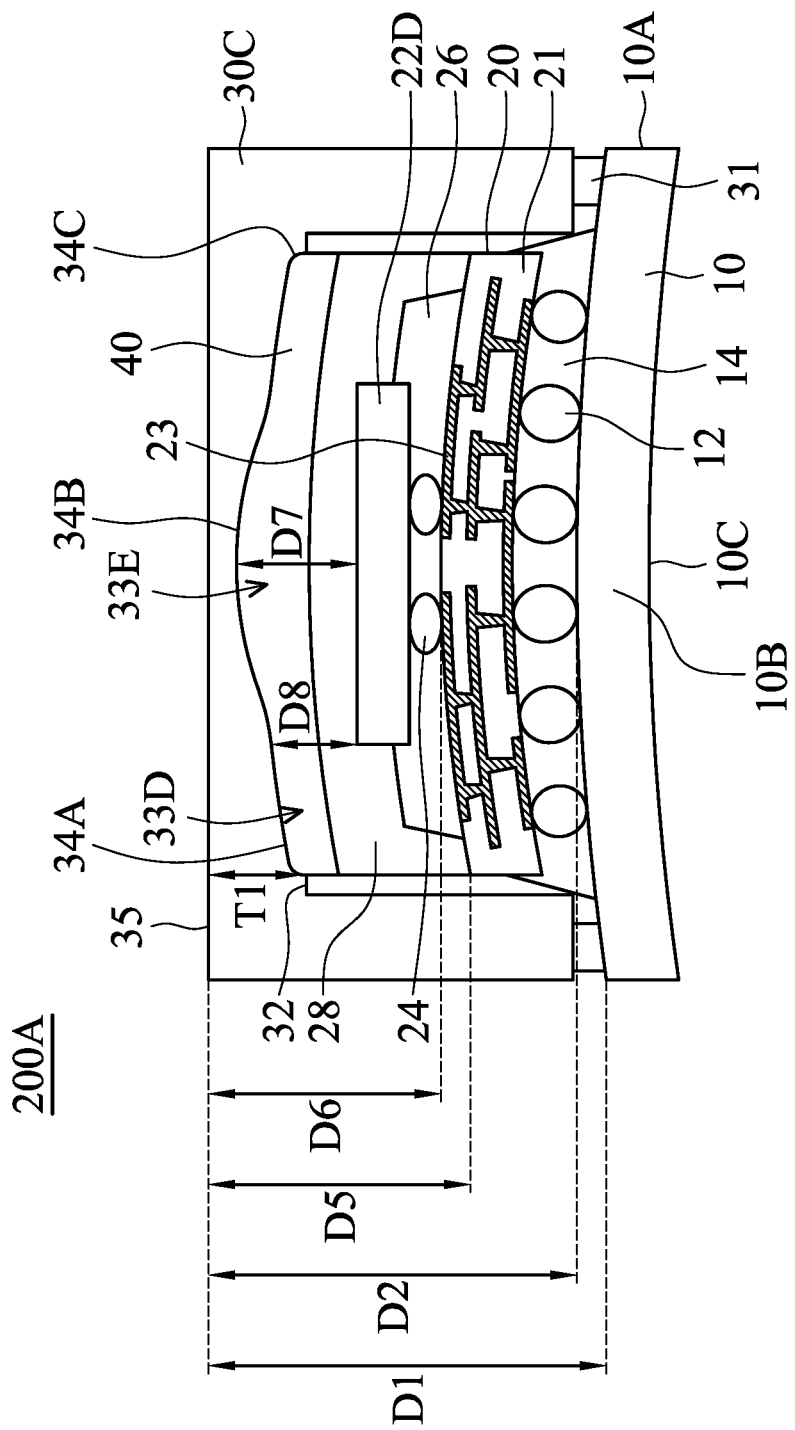
FIG. 3A is a cross-sectional view of a semiconductor package structure, in accordance with some embodiments.

FIG. 3A is a cross-sectional view of a semiconductor package structure 200A, in accordance with some embodiments of the present disclosure. The semiconductor package structure 200A includes a lid 30C. In some embodiments, the lid 30C includes a recess 33D formed on the lower surface 32 of the lid 30C, and the lid 30C further includes a recess 33E formed in the recess 33D. In some embodiments, the depth of the recess 33D is less than the depth of the recess 33E. For example, as shown in FIG. 3A, a distance D7 between a bottom surface 34A of the recess 33D and the top surface of the semiconductor device 22D is less than a distance D8 between a bottom surface 34B of the recess 33E and the top surface of the semiconductor device 22D. In some embodiments, the recess 33D includes a sidewall 34C, and the thermal interface material 40 is in contact with the sidewall 34C.

Figure 3B:
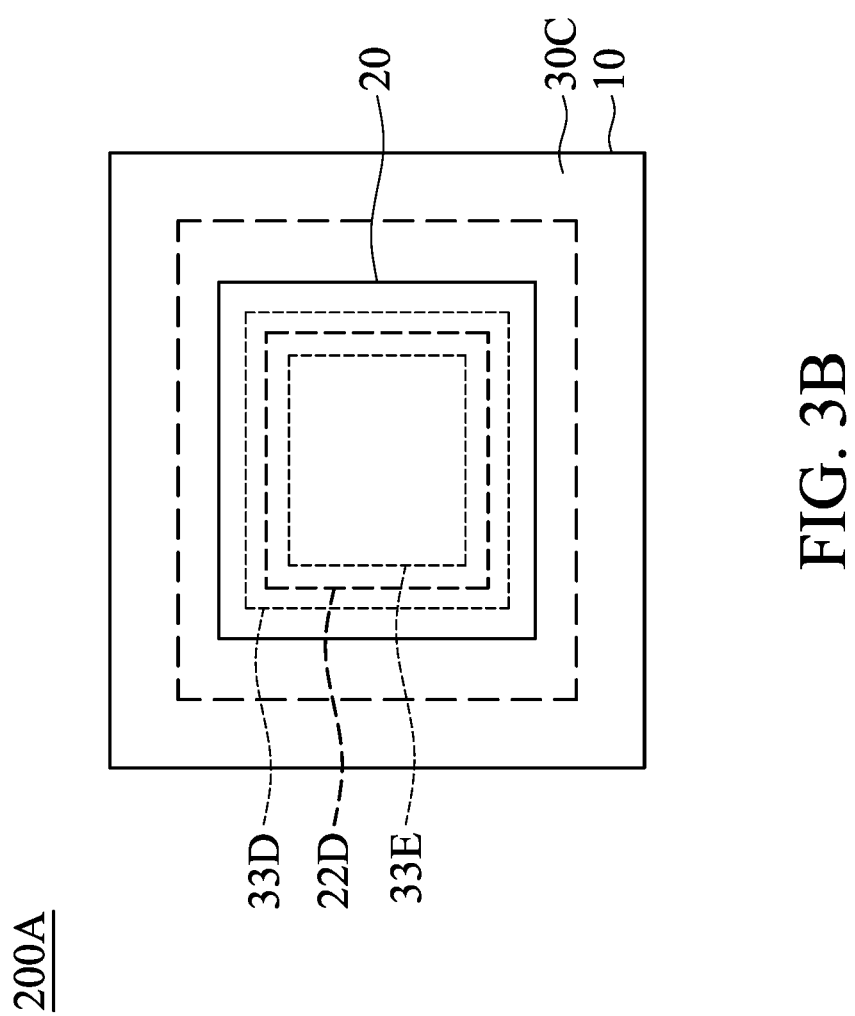
FIG. 3B is a top view of a semiconductor package structure, in accordance with some embodiments.

FIG. 3B is a top view of the semiconductor package structure 200A, in accordance with some embodiments of the present disclosure. As shown in FIG. 3B, the size of the semiconductor device 22D is less than the area of the recess 33D, and greater than the area of the recess 33E. In some embodiments, the recess 33E is inside the semiconductor device 22D, and the semiconductor device 22D is inside the recess 33D in the top view.

Figure 4:
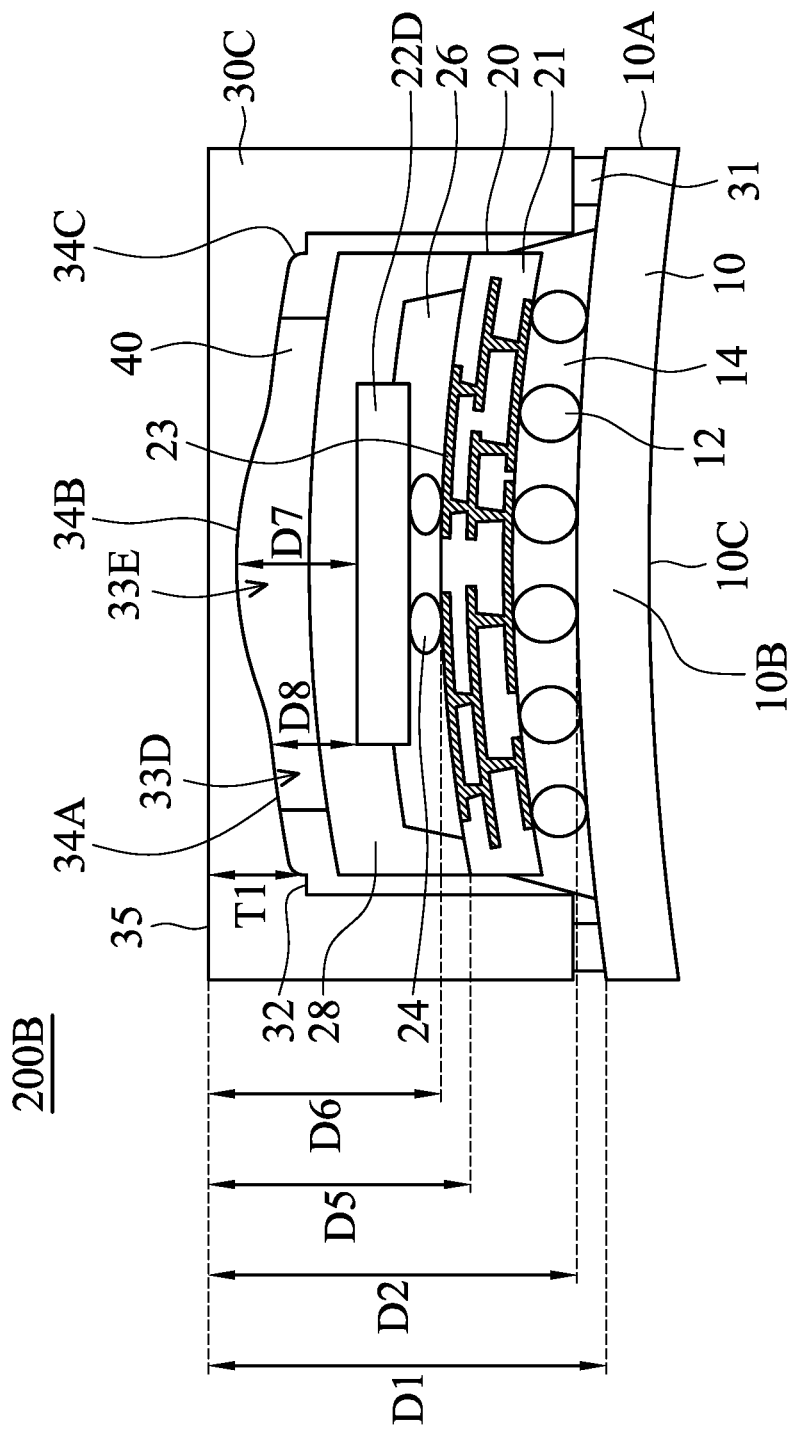
FIG. 4 is a cross-sectional view of a semiconductor package structure, in accordance with some embodiments.

FIG. 4 is a cross-sectional view of a semiconductor package structure 200B, in accordance with some embodiments of the present disclosure. In FIG. 4, the thermal interface material 40 of the semiconductor package structure 200B is separated from a portion of the sidewall 34C of the lid 30C, in accordance with some embodiments of the present disclosure. In some embodiments, a portion of the bottom surface 34A of the lid 30C is exposed from the thermal interface material 40.

Figure 5B:
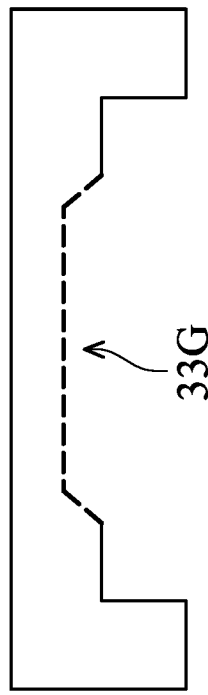
FIG. 5B is a cross-sectional view of a lid, in accordance with some embodiments.
Figure 5C:
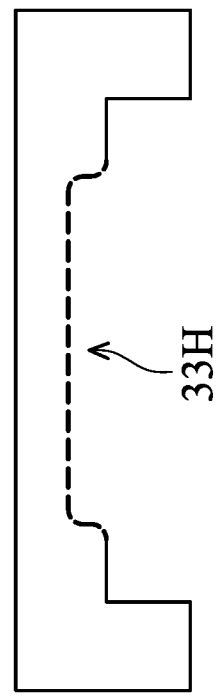
FIG. 5C is a cross-sectional view of a lid, in accordance with some embodiments.
Figure 5A:
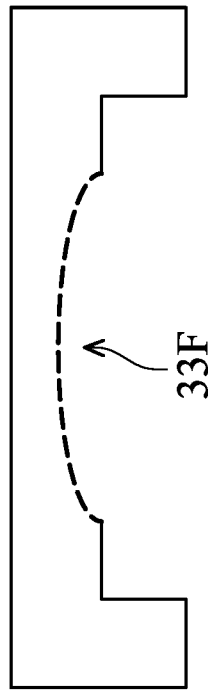
FIG. 5A is a cross-sectional view of a lid, in accordance with some embodiments.

FIG. 5A is a cross-sectional view of a lid 30D, FIG. 5B is a cross-sectional view of a lid 30E, and FIG. 5C is a cross-sectional view of a lid 30F, in accordance with some embodiments of the present disclosure. In some embodiments, the lids 30, 30A, 30B, 30C may be substituted by the lids 30D, 30E, or 30F, depending on design requirement. In some embodiments, as shown in FIG. 5A, the lid 30D has a recess 33F on its lower surface. In the cross-sectional view, the recess 33F has a curvy and concave shape. In some embodiments, as shown in FIG. 5B, the lid 30E has a recess 33G on its lower surface. In the cross-sectional view, the recess 33G has a slanted edge. In some embodiments, as shown in FIG. 5C, the lid 30F has a recess 33H on its lower surface. In the cross-sectional view, the recess 33H has a rounded edge. Various shapes of the recesses enhance the design flexibility, in accordance with some embodiments of the present disclosure.

Figure 6:
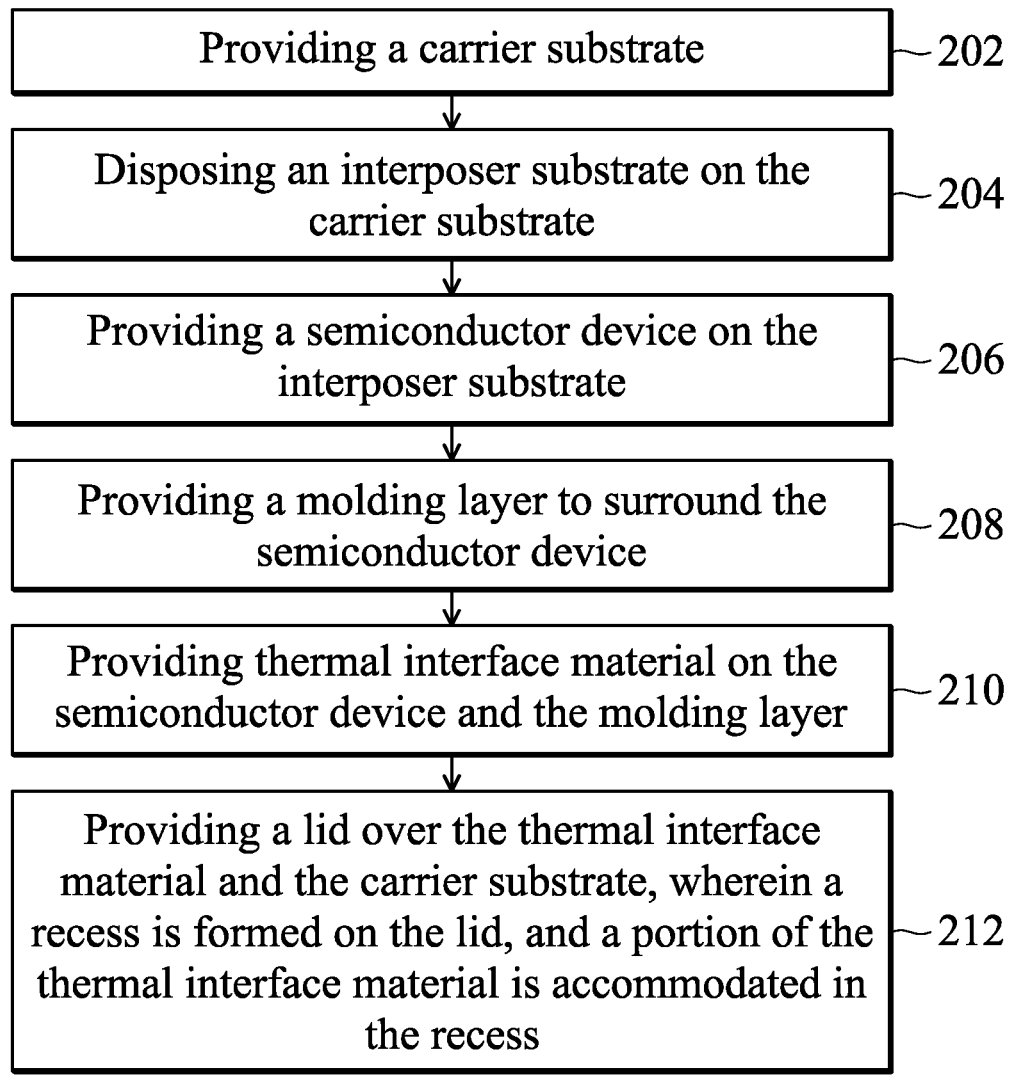
FIG. 6 shows a flow diagram of a method for forming the semiconductor package structure, in accordance with some embodiments.

FIG. 6 shows a flow diagram of a method 200 for forming the semiconductor package structure, in accordance with some embodiments. The method 200 starts from a step 202, wherein a carrier substrate is provided in some embodiments of the present disclosure. The method 200 continues to a step 204, wherein an interposer substrate is disposed on the carrier substrate in some embodiments of the present disclosure. The method 200 continues to a step 206, wherein a semiconductor device is provided on the interposer substrate in some embodiments of the present disclosure. The method 200 continues to a step 208, wherein a molding layer is provided to surround the semiconductor device in some embodiments of the present disclosure. The method 200 continues to a step 210, wherein thermal interface material is provided on the semiconductor device and the molding layer in some embodiments of the present disclosure. The method 200 continues to a step 212, wherein a lid is provided over the thermal interface material and the carrier substrate in some embodiments of the present disclosure. The lid has a recess forming on a lower surface of the lid facing the semiconductor device, and a portion of the thermal interface material is accommodated in the recess in some embodiments of the present disclosure.

A semiconductor package structure includes a lid disposed on the semiconductor device, and a recess is formed on a lower surface of the lid facing the semiconductor device in some embodiments of the present disclosure. Such design can enhance the heat dissipation and the reliability of the semiconductor package structure after being heated and deformed during the manufacture process.

A method of forming a semiconductor package structure is provided in some embodiments of the present disclosure. The method includes disposing a first semiconductor device on an interposer substrate, disposing the interposer substrate on a carrier substrate, applying a thermal interface material on the first semiconductor device, and attaching a lid on the carrier substrate to cover the first semiconductor device. The interposer substrate is disposed between the carrier substrate and the first semiconductor device. The lid includes a lower surface having a first recess facing the first semiconductor device, and a portion of the thermal interface material is accommodated in the first recess.

A method of forming a semiconductor package structure is provided in some embodiments of the present disclosure. The method includes disposing a semiconductor device on an interposer substrate, and disposing a lid on the interposer substrate to surround the interposer substrate, wherein the lid has a curved surface overlapping a center of the semiconductor device in a top view.

A method of forming a semiconductor package structure is provided in some embodiments of the present disclosure. The method includes disposing a first semiconductor device on an interposer substrate, applying a thermal interface material over a top surface of the first semiconductor device, and disposing a lid over the thermal interface material, wherein the lid has a first recessed portion in contact with the thermal interface material,
wherein a width of the first recessed portion is greater than a width of the first semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package structure, comprising:
    disposing a first semiconductor device on an interposer substrate;
    disposing the interposer substrate on a carrier substrate, wherein the interposer substrate is disposed between the carrier substrate and the first semiconductor device;
    applying a thermal interface material on the first semiconductor device; and
    attaching a lid on the carrier substrate to cover the first semiconductor device, wherein the lid includes a lower surface having a first recess facing the first semiconductor device and a second recess in the first recess, and a portion of the thermal interface material is accommodated in the first recess and the second recess, wherein the second recess is surrounded by the first recess in a top view, and the first semiconductor device overlaps the first recess and the second recess.

2. The method as claimed in claim 1, wherein in the top view, the first semiconductor device is accommodated in the first recess.

3. The method as claimed in claim 1, further comprising performing a heating process to the semiconductor package structure, wherein the carrier substrate includes a lower surface concave toward the lid after the heating process.

4. The method as claimed in claim 3, wherein the lid includes a top surface, the interposer substrate comprises a middle portion and an edge portion surrounding the middle portion, and in a direction perpendicular to the top surface of the lid, a first distance is between the top surface of the lid and the edge portion, a second distance is between the top surface of the lid and the middle portion, and the first distance is greater than the second distance.

5. A method of forming a semiconductor package structure, comprising:
    disposing a semiconductor device on an interposer substrate; and
    disposing a lid on the interposer substrate to surround the interposer substrate, wherein the lid has a bottom surface and a first recess recessed from the bottom surface and having a curved surface overlapping a center of the semiconductor device in a top view.

6. The method as claimed in claim 5, wherein the lid further has a second recess in the curved surface.

7. The method as claimed in claim 5, wherein a width of the curved surface is greater than a width of the semiconductor device.

8. The method as claimed in claim 7, wherein the lid further has a second recess in the curved surface, and a width of the second recess is less than the width of the semiconductor device.

9. The method as claimed in claim 8, wherein the second recess overlaps the center of the semiconductor device in the top view.

10. A method of forming a semiconductor package structure, comprising:
    disposing a first semiconductor device on an interposer substrate;
    applying a thermal interface material over a top surface of the first semiconductor device; and
    disposing a lid over the thermal interface material, wherein the lid has a first recessed portion in contact with the thermal interface material,
    wherein a width of a bottom surface of the first recessed portion is greater than a width of the first semiconductor device, and the bottom surface overlaps a center of the first semiconductor device.

11. The method as claimed in claim 10, wherein a width of the thermal interface material is less than a width of the interposer substrate.

12. The method as claimed in claim 11, wherein the thermal interface material is separated from a sidewall of the first recessed portion.

13. The method as claimed in claim 10, further comprising applying an underfill layer over the interposer substrate and the first semiconductor device, wherein the width of the first recessed portion is greater than a width of the underfill layer.

14. The method as claimed in claim 10, wherein the thermal interface material is separated from the first semiconductor device.

15. The method as claimed in claim 10, wherein the lid further has a second recessed portion, wherein the second recessed portion is spaced apart from the first recessed portion in a top view.

16. The method as claimed in claim 10, further comprising forming a molding layer over the first semiconductor device, wherein the molding layer extends between the first semiconductor device and the thermal interface material.

17. The method as claimed in claim 1, wherein a first distance between a top surface of the first semiconductor device and a first bottom surface of the first recess is less than a second distance between the top surface of the first semiconductor device and a second bottom surface of the second recess.

18. The method as claimed in claim 1, wherein in the top view, a width of the first semiconductor device is less than a width of the first recess and greater than a width of the second recess.

19. The method as claimed in claim 5, further comprising disposing a molding layer surrounding the semiconductor device, wherein the molding layer has a curved top surface facing the lid.

20. The method as claimed in claim 10, wherein a first thickness at a center of the thermal interface material is greater than a second thickness at an edge of the thermal interface material.

* * * * *